(12) United States Patent
Graf et al.

(10) Patent No.: US 11,261,082 B2
(45) Date of Patent: Mar. 1, 2022

(54) MICROMECHANICAL DEVICE AND METHOD FOR MANUFACTURING A MICROMECHANICAL DEVICE

(71) Applicant: Robert Bosch GmbH, Stuttgart (DE)

(72) Inventors: Eckhard Graf, Gomaringen (DE); Holger Rumpf, Reutlingen (DE); Jens Frey, Filderstadt (DE); Jochen Reinmuth, Reutlingen (DE); Kurt-Ulrich Ritzau, Tuebingen (DE); Achim Breitling, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 152 days.

(21) Appl. No.: 16/717,370

(22) Filed: Dec. 17, 2019

(65) Prior Publication Data

US 2020/0198966 A1 Jun. 25, 2020

(30) Foreign Application Priority Data

Dec. 21, 2018 (DE) .......................... 102018222804.3

(51) Int. Cl.
*B81B 3/00* (2006.01)
*B81C 1/00* (2006.01)

(52) U.S. Cl.
CPC ........ *B81C 1/00119* (2013.01); *B81B 3/0097* (2013.01); *B81B 2203/0315* (2013.01); *B81B 2207/098* (2013.01); *B81C 2201/0132* (2013.01); *B81C 2203/0118* (2013.01); *B81C 2203/0172* (2013.01)

(58) Field of Classification Search
CPC ........................... B81B 3/0097; B81B 7/0061
See application file for complete search history.

(56) References Cited

U.S. PATENT DOCUMENTS

| | | | |
|---|---|---|---|
| 8,546,928 B2 | 10/2013 | Merz et al. | |
| 2005/0260783 A1 | 11/2005 | Lutz et al. | |
| 2013/0074596 A1* | 3/2013 | Takizawa | B81B 7/0041 73/504.12 |
| 2014/0037481 A1 | 2/2014 | Stephane | |
| 2014/0117475 A1* | 5/2014 | Classen | B81C 1/00246 257/418 |

(Continued)

FOREIGN PATENT DOCUMENTS

| | | |
|---|---|---|
| DE | 19537814 A1 | 4/1997 |
| DE | 10104868 A1 | 8/2002 |
| DE | 102014202801 A1 | 8/2015 |

(Continued)

*Primary Examiner* — Moazzam Hossain
(74) *Attorney, Agent, or Firm* — Norton Rose Fulbright US LLP; Gerard Messina

(57) ABSTRACT

A micromechanical device that includes a silicon substrate with an overlying oxide layer and with a micromechanical functional layer lying above same, which extend in parallel to a main extension plane, a cavity being formed at least in the micromechanical functional layer and in the oxide layer. An access channel is formed in the oxide layer and/or in the micromechanical functional layer which, starting from the cavity, extends in parallel to the main extension plane and in the process extends in a projection direction, as viewed perpendicularly to the main extension plane, all the way into an access area outside the cavity. A method for manufacturing a micromechanical device is also described.

11 Claims, 6 Drawing Sheets

(56) References Cited

U.S. PATENT DOCUMENTS

2015/0175408 A1* 6/2015 Lee .................... B81C 1/00293
257/787

FOREIGN PATENT DOCUMENTS

| DE | 102014214525 A1 | 2/2016 |
| DE | 102015220890 A1 | 4/2017 |
| DE | 102016100056 A1 | 5/2017 |
| DE | 102016218661 A1 | 3/2018 |

* cited by examiner

MICROMECHANICAL DEVICE AND METHOD FOR MANUFACTURING A MICROMECHANICAL DEVICE

CROSS REFERENCE

The present application claims the benefit under 35 U.S.C. § 119 of German Patent Application No. DE 102018222804.3 filed on Dec. 21, 2018, which is expressly incorporated herein by reference in its entirety.

FIELD

The present invention is directed to a micromechanical device that includes a silicon substrate with an overlying oxide layer and with a micromechanical functional layer lying above same, which extend in parallel to a main extension plane, a cavity being formed at least in the micromechanical functional layer and in the oxide layer.

BACKGROUND INFORMATION

Silicon-micromechanical-based sensors are employed in the automotive industry and in entertainment electronics for measuring acceleration, rotation rate, pressure, magnetic field and other parameters. The advantage of silicon wafer technology is that these sensors are fabricated on a mass production scale. The major trends in the ongoing development in the field of entertainment electronics are the miniaturization of the components, integration of multiple different functions, as well as cost reduction.

Various sensor elements are increasingly integrated into one component such as, for example, an acceleration and rotation rate sensor. Integration may take place both in a package as well as at the wafer level. If acceleration and rotation chips, which are designed for different damping by the cavity internal pressure, are placed on one wafer, it is possible to set the internal pressures in two different ways. U.S. Pat. No. 8,546,928 B2 describes the setting of a cavity internal pressure with the aid of getters. German Patent Application No. DE 102014202801 describes the production of two internal pressures in adjacent cavities on one wafer using a two-step method, opening with the aid of laser drilling or trenching, and resealing using a laser fusion method. The method is also suitable for enclosing a particularly low internal pressure in a cavity or enclosing a particularly temperature-sensitive medium.

SUMMARY

The present invention is directed to a micromechanical device that includes a silicon substrate with an overlying oxide layer and with a micromechanical functional layer lying above same, which extend in parallel to a main extension plane, a cavity being formed at least in the micromechanical functional layer and in the oxide layer. A main aspect of the present invention is that an access channel is formed in the oxide layer or also in the micromechanical functional layer, which extends, starting from the cavity, in parallel to the main extension plane and, in the process, extends in a projection direction as viewed perpendicularly to the main extension plane all the way into an access area outside the cavity.

One advantageous embodiment of the present invention provides that an additional access channel is formed in the functional layer, which extends perpendicularly to the main extension plane in the access area and is connected to the access channel. In the process, the access channel and, therefore, the cavity may be advantageously reached.

One advantageous embodiment of the present invention provides that the additional access channel is formed as a DRIE trench. In this way, a channel having a high aspect ratio and therefore minimal use of space may be advantageously created in the main extension plane.

One advantageous embodiment of the present invention provides that the additional access channel opens into a bonding pad area on an outer surface of the micromechanical device. In this way, the atmosphere in the cavity may be advantageously set. The additional access channel in this arrangement need not be guided through the cap.

It is advantageous if the functional layer in a subarea next to the access area is removed by introducing a recess there. A portion of the functional layer in the access area is advantageously fused with a laser pulse and the access channel is thus sealed. After solidification, the material cools locally and in the process contracts relative to the colder surroundings. A tensile stress forms within the material. This stress may be reduced at the margins of the functional layer, thus, it is advantageous to remove subareas of the functional layer closely around the melt zone to the extent possible. It is further advantageous to provide the edges of the functional layer preferably close to the melt zone. Narrow and high geometries of the functional layer are particularly advantageous around the area of the melt zone in order to enable a positive stress reduction.

It is advantageous if an edge of the functional layer is provided with space toward the melt zone that is less than double the diameter of the melt zone.

It is particularly advantageous if the melt zone is provided on a tongue of the functional layer, the width of which is less than five times the diameter of the melt zone.

It is advantageous if the length of the tongue in a direction perpendicular to the edge of the access area corresponds to at least half the width of the tongue in a direction parallel to the edge.

It is further advantageous if the thickness of the functional layer is at least a fifth of the width of this structure in a direction parallel to the edge of the access area.

It is further advantageous if the diameter of the vertical opening in the area of the micromechanical functional layer is less than half the width of the functional layer in a direction perpendicular to the edge of the access area and/or the diameter of the vertical opening is less than double the layer thickness of the functional layer. The access may not become too large, since otherwise too little material is present after the fusion and the height forming after solidification becomes too low.

It is further desirable that only the functional layer and no material or not too much material of the substrate fuses, in order after solidification to create preferably little stress in the substrate as well. On the one hand, therefore, it is advantageous for the functional layer and the structure below the functional layer to use a material system, which has a thermal conductivity that is lower than that of the substrate. At the same time, it is advantageous to melt the functional layer using a short laser pulse, in order in this way to utilize the substrate as a heat sink. The result that may be achieved by this is that the functional layer fuses, but the substrate does not fuse at all or fuses locally only to a very limited degree due to the comparatively better heat conductivity, to the more favorable geometry and due to the chronological dynamics.

The present invention also relates to a method for manufacturing a micromechanical device. With the example method according to the present invention, it is possible to dispense with the previously required additional process steps. The place in the micromechanical device previously utilized as a beam trap may be omitted. This makes a smaller and more cost-efficient component possible.

The opening process using a laser drilling method or trench process may chemically and electrically change the surface of the micromechanical functional elements. In the method according to the present invention, the opening process takes place locally far separate from the micromechanical functional elements and also outside the cavity. In this way, the surface of the micromechanical functional elements is better protected from chemical and electrical changes.

In the related art, the local surface for the seal, before being sealed, is set back under the original surface of the cap wafer using a laser in order to prevent damage to the sealing point during subsequent handling and packaging steps. The setting back may take place technically only to a very limited extent. In the example method according to the present invention, the seal is situated significantly deeper by design and is therefore better protected during subsequent handling and packaging steps.

In the related art, a certain degree of tensile stress is incorporated in the material during laser sealing. In the example method according to the present invention, significantly less stress is incorporated in all material components. Accordingly, the seal becomes mechanically more robust and less sensitive.

In the related art, the laser pulse must strike the opening to be sealed very precisely so that a symmetrical stress distribution forms around the access channel after solidification and a crack formation is avoided. According to embodiments of the present invention, a self-adjusting effect of the laser relative to the structure of the functional layer is achieved by the structuring of the functional layer and by the selected thermal conductivities, as a result of which a significantly improved and less sensitive manufacturability is provided.

DETAILED DESCRIPTION OF EXAMPLE EMBODIMENTS

Figure 1:
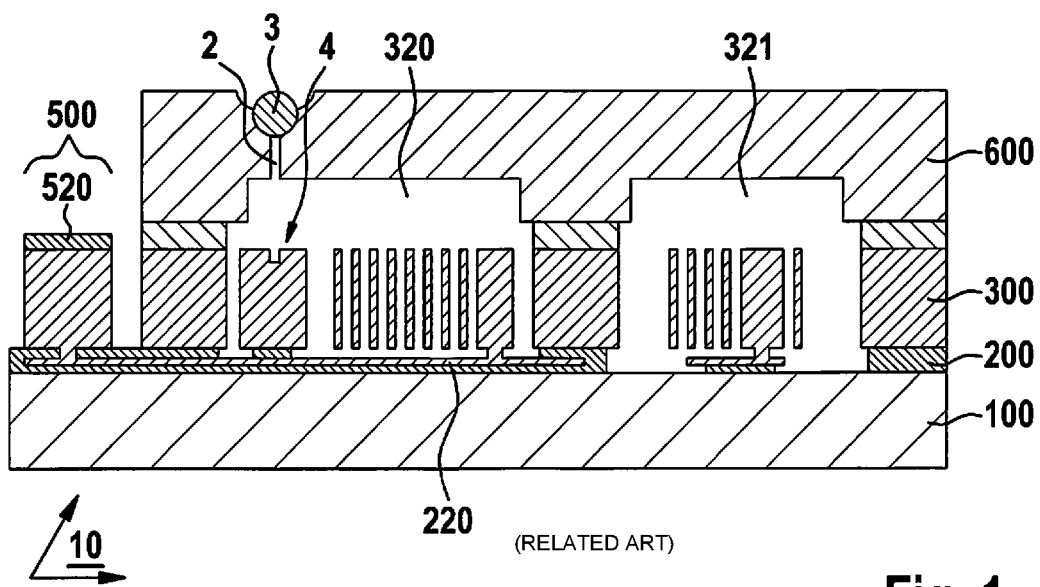
FIG. 1 shows a micromechanical device in the related art.

FIG. 1 shows a micromechanical device in the related art. The device includes a silicon substrate 100 with an overlying oxide layer 200 and with a micromechanical functional layer 300 lying above same, which extend in parallel to a main extension plane 10. Oxide layer 200 is constructed of multiple layers and contains at least one electrical wiring plane 220, which contacts the micromechanical device. Two cavities 320, 321 are formed in micromechanical functional layer 300 and in oxide layer 200. The cavities are closed off by a cap 600. A vertical access channel 2 is introduced through cap 600 into cavity 320. Situated opposite access channel 2 is a beam trap 4. In addition, micromechanical functional structures are situated in cavity 320. Access channel 2 is sealed with a laser melt seal 3. A bonding pad area 500, which is formed in functional layer 300, is situated next to cap 600 as viewed perpendicularly to main extension plane 10. Bonding pad area 520 includes bonding pads 500 which are used to electrically contact the micromechanical device.

German Patent Application No. DE 102014202801 describes the production of two internal pressures in adjacent cavities on one wafer using a two-step method.

In this method, a gas permeable channel 2 is initially created in the cap wafer ("vent hole") by silicon etching with the aid of the Bosch process (DRIE, "trenching"). This etching step, together with the exposing of bonding pad 520, may take place for an outer contacting of the MEMS element. However, the process time of the etching step is increased due to the higher aspect ratio of the ventilation channel, as compared to an etching step without this channel.

In a subsequent step, the desired gas pressure is set and the channel is subsequently hermetically sealed from above with a laser melt seal with the aid of a short laser pulse. Excess laser energy is absorbed by beam trap 4 in the process.

A peak forms during the melting and solidification. In order to prevent damage to the sealing point during subsequent handling and packaging steps, the local surface for the seal is set back under the original surface of the cap wafer with a laser before the sealing, as is described in German Patent Application No. DE 102015220890. Since the intensity of the laser beam is selected in such way that the silicon melts and a vent hole is provided for ventilation, laser radiation also passes to the surface of the sensor wafer. For this reason, no electrically active circuits or mechanical structures are situated below the ventilation channel.

Figure 2A:
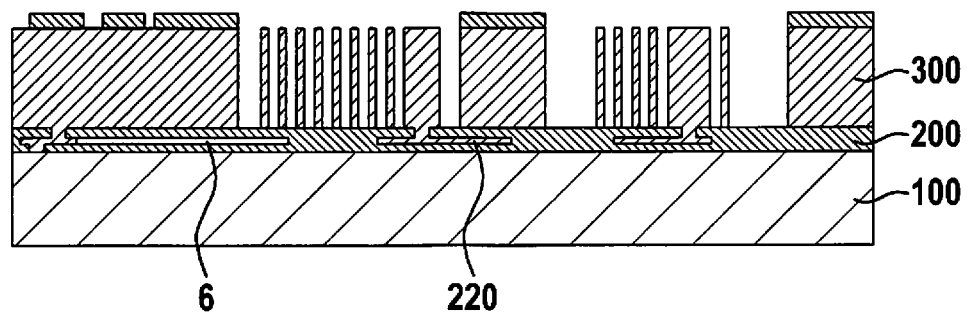
FIGS. 2A through 2G show a micromechanical device according to the present invention that includes a horizontal access channel in individual stages of manufacture.

FIGS. 2A through 2D show a micromechanical device according to the present invention that includes a horizontal access channel in individual stages of manufacture. FIG. 2A shows a silicon substrate 100 in a first stage, with an overlying oxide layer 200 and with a micromechanical functional layer 300 lying above same, which extend in parallel to a main extension plane 10. Oxide layer 200 is constructed in multiple layers and contains at least one electrical wiring plane 220, which contacts the micromechanical device. Two cavities 320, 321 are created in micromechanical layer 300 and in oxide layer 200. Situated in cavities 320, 321 are micromechanical functional structures. A horizontal oxide channel with a cavity 6 is created in oxide layer 200 which, starting from a bonding pad area 500, reaches all the way to cavity 320.

Figure 2B:
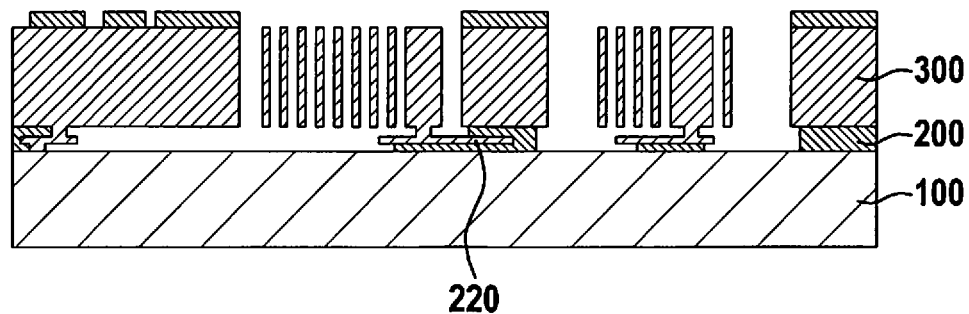

FIG. 2B shows the micromechanical device in a second stage with an access channel 250, which is formed in the dielectric layer, namely in oxide layer 200. Access channel 250, starting from cavity 320, extends in parallel to main extension plane 10. In this case, it extends in a projection direction 20, as viewed perpendicularly to main extension direction 10, all the way to bonding pad area 500. Access channel 250 is formed from the horizontal oxide channel including the cavity. For this purpose, the oxides around the horizontal etching access have been removed by gas phase etching.

Figure 2C:
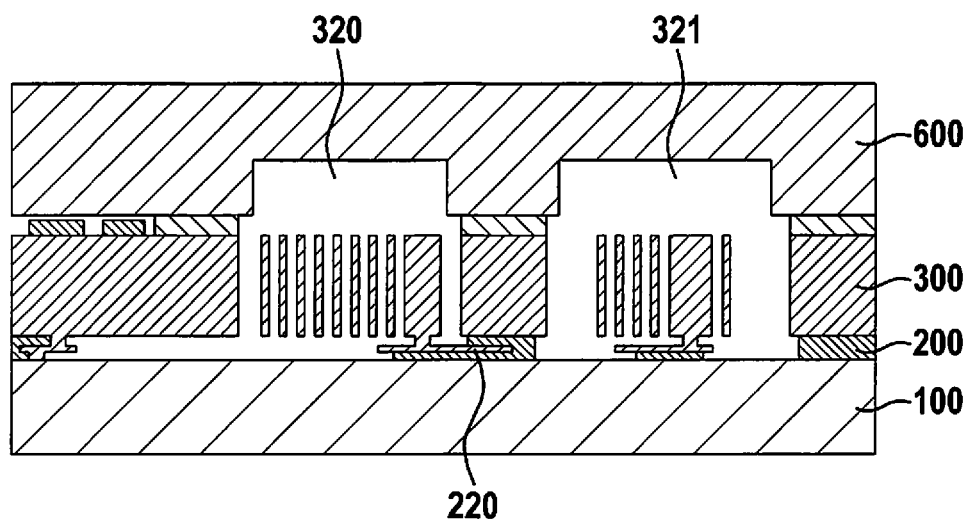

FIG. 2C shows the micromechanical device in a second stage with a capping of the device including with a cap 600, which closes off cavity 320 and additional cavity 321. Cap 600 in this case is formed by a cap wafer, which has been applied subsequently with the aid of wafer bonding.

Figure 2D:
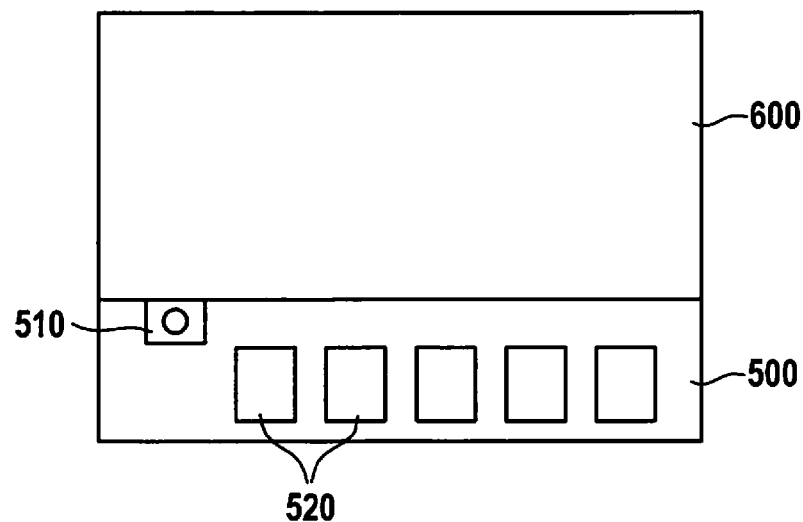

FIG. 2D shows a top view of the capped micromechanical device. Cap 600 is depicted next to adjacent bonding pad area 500. An etching mask 510 is situated in bonding pad area 500 next to bonding pad 520. Etching mask 510 defines access area 400 and the cross section of additional access channel 350, which is subsequently advanced from this point.

Figure 2E:
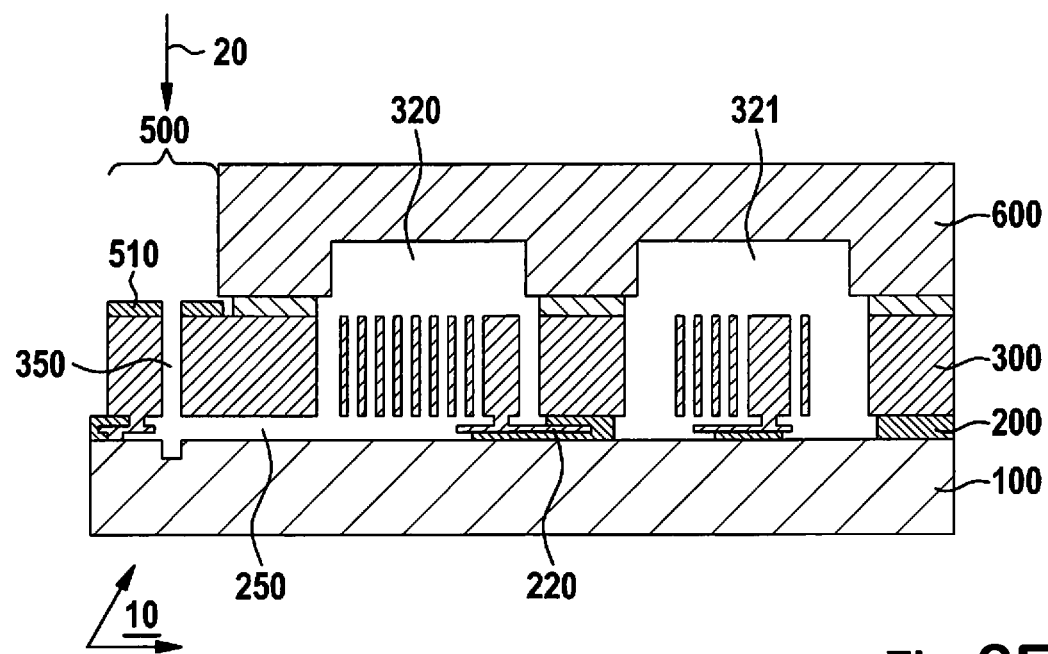

FIG. 2E shows a micromechanical device according to the present invention in a first exemplary embodiment. In contrast to the device in the related art, the micromechanical device according to the present invention includes a horizontal access channel 250 in oxide layer 200, i.e., an access channel which, starting from cavity 320, extends in parallel to main extension plane 10 and, in the process extends in a projection direction 20, as viewed perpendicularly to main extension plane 10, into an access area 400 outside cavity 320. In the exemplary embodiment depicted, an additional access channel 350 is formed in functional layer 300, which extends perpendicularly to main extension plane 10 in access area 400 and is connected to access channel 250. Additional access channel 350 opens into access area 400, which is part of bonding pad area 500, on an outer surface of the micromechanical device. Additional access channel 350 is created in the same process step by trenching as the bonding pad is exposed and in this way, the access to access channel 250 is also created.

Figure 2F:
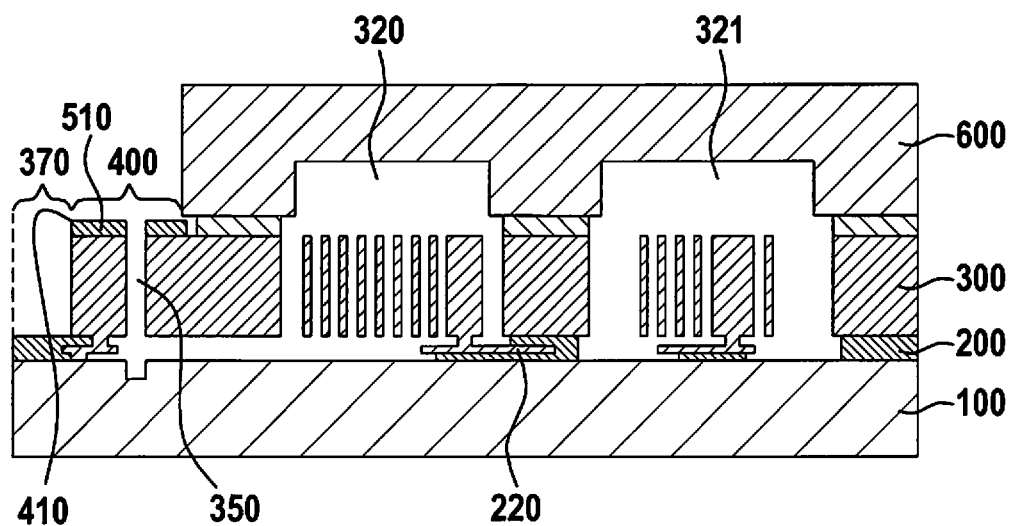

FIG. 2F shows a micromechanical device according to the present invention in a second exemplary embodiment. In contrast to the device in FIG. 2E, functional layer 300 here includes a recess 370 next to access area 400. For this reason, access area 400 includes an edge 410 there. Thus, access area 400 in this case is a structure in the functional layer, through which additional access channel 350 extends in the manner of a tube.

Figure 2G:
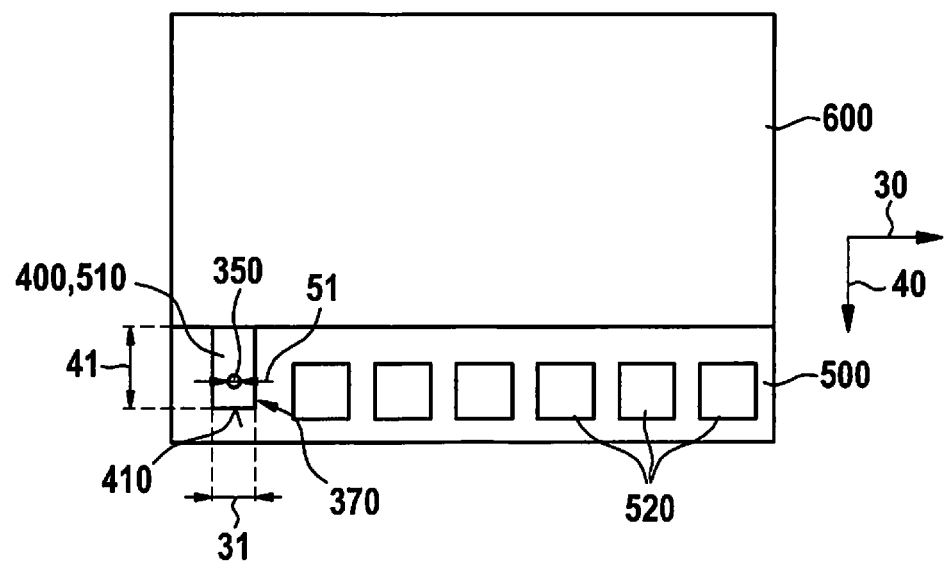

FIG. 2G shows a top view of the capped micromechanical device with a recess next to the access area. The micromechanical functional layer 300 is removed in a subarea around access area 400 where it includes a recess 370. The access area has a width 31 in a first direction 30 in parallel to edge 410 and a length 41 in a second direction 40. Additional access channel 350 has a diameter 51. Around the opening of the additional channel, a melt zone is provided, the dimensions of which are sufficient to seal the additional access channel with a melt from the material of access area 400.

Figure 3:
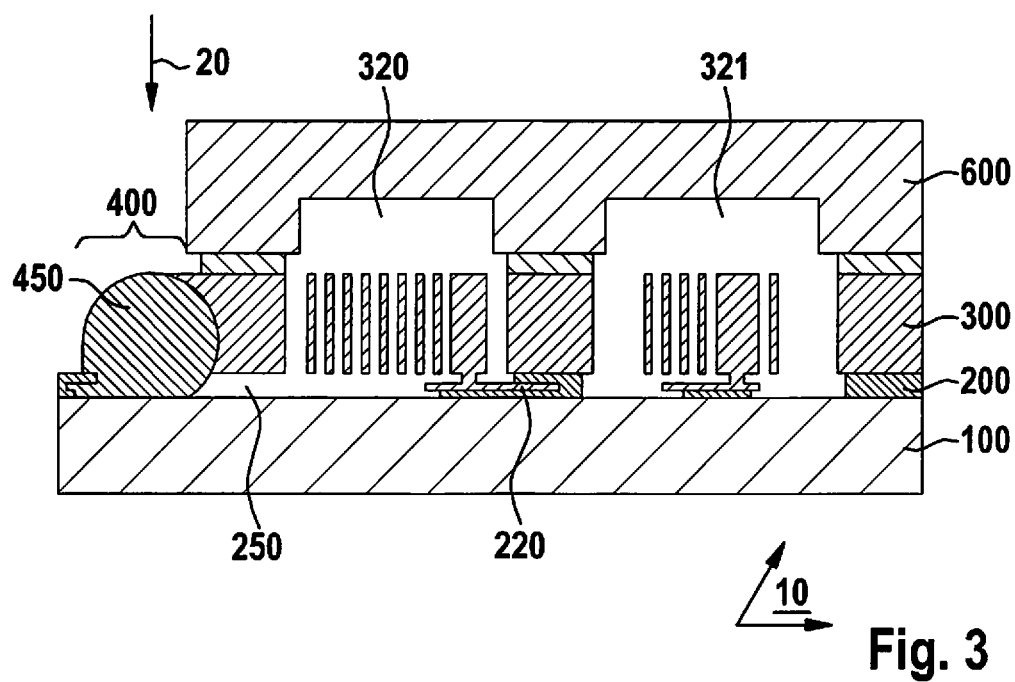
FIG. 3 shows a micromechanical device according to the present invention that includes a sealed horizontal access channel.

FIG. 3 shows a micromechanical device according to the present invention, including a sealed access channel. In this exemplary embodiment, entire additional channel 350 as well as a portion of access channel 250 in access area 400 is back-filled with a melt seal 450 and is thereby sealed.

Figure 4:
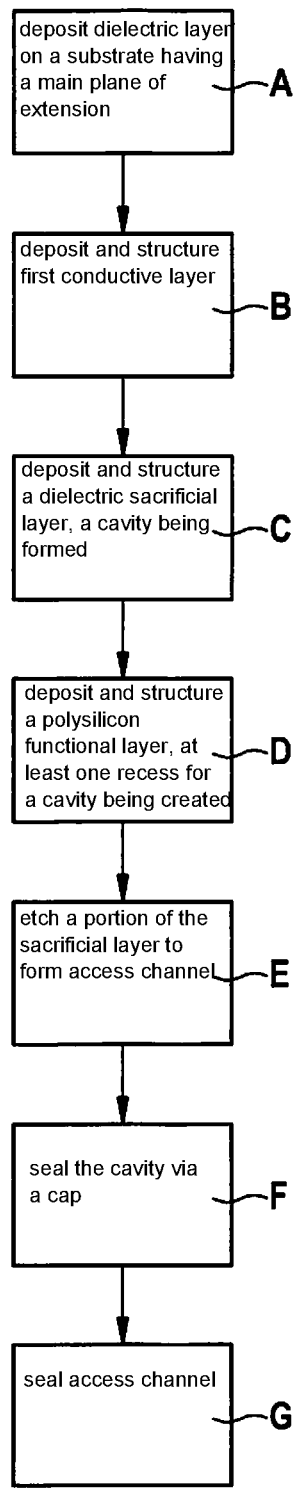
FIG. 4 schematically shows a method according to the present invention for manufacturing a micromechanical device.

FIG. 4 schematically shows a method according to the present invention for manufacturing a micromechanical device. The method has the sequential steps:

(A)—depositing a dielectric layer on a substrate having a main extension plane;

(B)—depositing and structuring a first conductive layer;

(C)—depositing and structuring a dielectric sacrificial layer, a cavity being formed with this deposition, which extends in parallel to the main extension plane;

(D)—depositing and structuring a polysilicon functional layer, at least one recess for a cavity being created;

(E)—etching a portion of the sacrificial layer, preferably using a gas phase etching method using HF, an access channel being formed from the cavity, which extends, starting from the cavity, in parallel to the main extension plane and in the process extends in a projection direction, as viewed perpendicularly to the main extension plane, into an access area outside the cavity.

(F)—sealing the cavity via a cap.

Optionally or later, the access channel in the access area is sealed in a step (G), preferably via a local fusing of the functional layer using a laser pulse.

A preferred manufacturing process proceeds, in particular, as follows:

A dielectric layer is initially deposited on a substrate. An oxide layer is preferably deposited. The layer may be optionally structured in order, for example, to produce a substrate contact. A first conductive layer is subsequently deposited and structured. A doped polysilicon layer is preferably used. Additional dielectric layers and additional electrical wiring layers or functional layers may optionally also be deposited and structured. A dielectric sacrificial layer is deposited and structured. This is preferably an oxide layer, cavities being produced with this deposition which, starting from cavity 320, extend in parallel to main extension plane 10 and in the process extend in a projection direction 20, as viewed perpendicularly to main extension plane 10, into an access area 400 outside cavity 320. A conductive functional layer is deposited and structured. A polysilicon functional layer is preferably used for this purpose. A sacrificial layer is etched. A gas phase etching method using hydrofluoric acid (HF) is preferably used for this purpose. The cavity is sealed. This takes place preferably using a bonding method and a cap wafer. An access area is exposed by etching through the sealing layer or the cap wafer. A bonding pad area 500 is preferably exposed at the same time. In one particularly advantageous variant, vertical access 350 to horizontal channel 250 is also produced with the etching process for producing the access area. At the same time, the functional layer in the access area may also be structured as a result. Because this etching may take place only after the etching of the sacrificial layer, the sacrificial layer is maintained as a protective layer in the access area.

The structuring takes place either via an additional layer, which is situated and structured on the functional layer. This is an Al layer, for example, which is required in any case as a contact layer. Or the structuring takes place via an additional layer, which is applied to and structured on the underside of the cap wafer, for example, via an oxide layer. The first cavity may optionally be preconditioned via various and combined temperature steps and/or cleaning steps and/or deposition steps, for example, ALD (atomic layer deposition).

The sealing of the access channel in an area outside the cavity takes place in a final step, preferably at a defined temperature and defined pressure and defined atmosphere, preferably via a local fusing of the functional layer using a laser pulse.

According to the present invention, a lateral access to the cavity is created, starting from the bonding pad area. For this purpose, a horizontally extending, gas permeable channel is created, which is located below the bonding frame for the connection of cap wafer and sensor wafer. An access channel is also created during the processing. In the simplest case, a first oxide layer is deposited on the substrate. Deposited and structured on the oxide layer as an electrical wiring layer is a doped polysilicon layer. A trench that is very narrow compared to the layer thickness of the polysilicon layer, with a preferably perpendicular or overhanging flank, is etched into the polysilicon layer in the area in which the access channel is to be formed. An additional oxide layer is subsequently deposited. Due to the high aspect ratio (width to height) of the trench, the narrow trench is not able to be completed filled with oxide. A cavity remains inside the narrow trench, which may be subsequently utilized as an access channel. The step with which the MEMS functional layer is exposed, the gas phase etching, may be utilized in order to widen the access channel and to partially remove the oxide surrounding it. Multiple methods, as described in the document DE10 2011 080 978, may also be used in order to produce a cavity. Access channel 250 need not necessarily be created as a cavity already before capping. It is also possible, for example, that the access channel is provided in sensor wafers only in a sacrificial material and this sacrificial material is removed only after the capping via a selective etching process. This channel extending within the plane of the sensor wafer extends horizontally from the outer contact area up to the sensor core within the cavity, which is produced by the cap wafer (see FIG. 1: position 5). The access in the contact area is exposed from above via a plasma etching step. A masking is necessary in the area of the channel in the contact area in order to ensure that silicon remains for the later capping. This masking may be made of a thin layer of aluminum or silicon oxide.

Alternatively, an opening of the sensor planes may already be provided in earlier process steps.

The access channel or the additional access channel is subsequently sealed using the method described in German Patent Application No. DE 102014202801. This method allows silicon to be fused with the aid of a laser and once solidified, ensures a permanent hermetically tight seal.

LIST OF REFERENCE NUMERALS 2 perpendicular access channel
3 laser melt seal
4 laser beam trap
6 oxide channel with cavity
10 main extension plane
20 projection direction
30 first direction parallel to the edge of the access area
31 width of the functional layer in a first direction parallel to the edge of the access area
40 second direction perpendicular to the edge of the access area
41 length of the access area in a second direction perpendicular to the edge of the access area
51 diameter of the additional access channel
100 silicon substrate
200 oxide layer
220 electrical wiring plane
250 access channel
300 functional layer
320 cavity
321 additional cavity
350 additional access channel
370 recess in the functional layer
400 access area
410 edge
450 melt seal
500 bonding pad area
510 etching mask for additional access channel
520 bonding pad
600 cap

What is claimed is:

1. A micromechanical device, comprising:
a silicon substrate with an overlying dielectric layer and with a micromechanical functional layer lying above the dielectric layer, the dielectric layer and the micromechanical function layer extending in parallel to a main extension plane of the silicon substrate, a cavity being formed at least in the micromechanical functional layer and in the dielectric layer;
an access channel formed in the dielectric layer and/or in the micromechanical functional layer, the access channel extending, starting from the cavity, in parallel to the main extension plane and extending in a projection direction, as viewed perpendicularly to the main extension plane, all the way into an access area outside the cavity,
wherein the micromechanical functional layer includes a recess in a subarea around the access area outside the cavity.

2. The micromechanical device as recited in claim 1, wherein an additional access channel is formed in the functional layer, the additional access channel extending perpendicularly to the main extension plane in the access area and is connected to the access channel.

3. The micromechanical device as recited in claim 2, wherein the additional access channel is formed as a DRIE trench.

4. The micromechanical device as recited in claim 2, wherein the additional access channel opens into a bonding pad area at an outer surface of the micromechanical device.

5. The micromechanical device as recited in claim 1, wherein the cavity is covered with a cap wafer and the access channel extends in the projection direction, as viewed perpendicularly to the main extension plane, all the way into the access area outside the cap wafer.

6. The micromechanical device as recited in claim 2, wherein the additional access channel has a diameter, which is less than double the layer thickness of the micromechanical functional layer.

7. The micromechanical device as recited in claim 1, wherein:
   (i) a thermal conductivity of the micromechanical functional layer in the projection direction is less than a thermal conductivity of the substrate in the projection direction, and/or
   (ii) a thermal conductivity of additional layers between the substrate and the micromechanical functional layer within the access area in the projection direction is less than a thermal conductivity of the substrate in the projection direction.

8. The micromechanical device as recited in claim 2, wherein the access channel and/or the additional access channel in the access area is sealed with a melt seal.

9. The micromechanical device as recited in claim 7, wherein the access channel in the area outside the cavity and outside the additional access channel is covered completely by the micromechanical functional layer in a projection direction as viewed perpendicularly to the main extension plane.

10. A micromechanical device, comprising:
a silicon substrate with an overlying dielectric layer and with a micromechanical functional layer lying above the dielectric layer, the dielectric layer and the micromechanical function layer extending in parallel to a main extension plane of the silicon substrate, a cavity being formed at least in the micromechanical functional layer and in the dielectric layer;
an access channel formed in the dielectric layer and/or in the micromechanical functional layer, the access channel extending, starting from the cavity, in parallel to the main extension plane and extending in a projection direction, as viewed perpendicularly to the main extension plane, all the way into an access area outside the cavity, wherein an additional access channel is formed in the functional layer, the additional access channel extending perpendicularly to the main extension plane in the access area and is connected to the access channel, wherein the micromechanical functional layer in the access area is structured and the access area includes an edge, and wherein:
(i) the edge is situated by less than double a diameter of a melt zone apart from the melt zone, and/or
(ii) the access area has a maximum length in a second direction perpendicular to the edge, which is at least half a minimum width of the access area in a first direction parallel to the edge, and/or
(iii) the access area has a tongue-shaped design, the narrowest point of the tongue having a width that is five times less than the diameter of the melt zone, and/or
(iv) the access area has a tongue shaped design, the narrowest point of the tongue having a width that corresponds to less than five times a thickness of the micromechanical functional layer.

11. The micromechanical device as recited in claim 10, wherein the additional access channel has a diameter which is less than half a length of the access area in the second direction perpendicular to the edge.

\* \* \* \* \*